(12) United States Patent
Shishido et al.

(10) Patent No.: US 10,712,655 B2
(45) Date of Patent: Jul. 14, 2020

(54) MASK BLANK, TRANSFER MASK, METHOD FOR MANUFACTURING TRANSFER MASK, AND METHOD FOR MANUFACTURING SEMICONDUCTOR DEVICE

(71) Applicant: HOYA CORPORATION, Tokyo (JP)

(72) Inventors: Hiroaki Shishido, Tokyo (JP); Yasutaka Horigome, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 0 days.

(21) Appl. No.: 16/317,204

(22) PCT Filed: Jun. 22, 2017

(86) PCT No.: PCT/JP2017/022984
§ 371 (c)(1),
(2) Date: Jan. 11, 2019

(87) PCT Pub. No.: WO2018/020913
PCT Pub. Date: Feb. 1, 2018

(65) Prior Publication Data
US 2019/0317394 A1    Oct. 17, 2019

(30) Foreign Application Priority Data
Jul. 25, 2016    (JP) .................................. 2016-145298

(51) Int. Cl.
*G03F 1/58*    (2012.01)
*G03F 1/22*    (2012.01)
(Continued)

(52) U.S. Cl.
CPC .................. *G03F 1/58* (2013.01); *G03F 1/22* (2013.01); *G03F 1/78* (2013.01); *G03F 7/2006* (2013.01);
(Continued)

(58) Field of Classification Search
None
See application file for complete search history.

(56) References Cited

U.S. PATENT DOCUMENTS 9,645,485 B2 *    5/2017    Kosaka ..................... G03F 1/32
10,372,030 B2 *    8/2019    Sasamoto ................. G03F 1/32
(Continued)

FOREIGN PATENT DOCUMENTS

JP    08-220731 A    8/1996
JP    2003-322948 A    11/2003
(Continued)

OTHER PUBLICATIONS

International Search Report of PCT/JP2017/022984 dated Sep. 19, 2017.

*Primary Examiner* — Allan W. Olsen
(74) *Attorney, Agent, or Firm* — Kilpatrick Townsend & Stockton LLP

(57) ABSTRACT

This mask blank is provided with a light blocking film on a light transmitting substrate. The light blocking film has an optical density of 2.5 or more with respect to ArF excimer laser exposure light, and has a structure that comprises three or more multilayer structures, each of which is composed of a high nitride layer and a low nitride layer. The high nitride layer and the low nitride layer are formed from a material that is composed of silicon and nitrogen or a material that contains one or more elements selected from among semi-metal elements and non-metal elements in addition to silicon and nitrogen. The high nitride layer has a nitrogen content of 50 atom % or more, and has a thickness of 10 nm or more. The low nitride layer has a nitrogen content of less than 50 atom %, and has a thickness that is not less than twice the thickness of the high nitride layer.

14 Claims, 2 Drawing Sheets

(51) Int. Cl.
*G03F 1/78* (2012.01)
*G03F 7/20* (2006.01)
*H01L 21/311* (2006.01)

(52) U.S. Cl.
CPC .. *H01L 21/31116* (2013.01); *H01L 21/31144* (2013.01)

(56) References Cited

U.S. PATENT DOCUMENTS

| | | | |
|---|---|---|---|
| 10,466,582 B2* | 11/2019 | Inazuki | H01J 37/3417 |
| 10,466,583 B2* | 11/2019 | Inazuki | G03F 1/32 |
| 2003/0047691 A1 | 3/2003 | Musil et al. | |
| 2004/0086788 A1 | 5/2004 | Shiota et al. | |
| 2011/0053057 A1* | 3/2011 | Nozawa | G03F 1/46 |
| | | | 430/5 |
| 2015/0338731 A1* | 11/2015 | Nozawa | H01L 21/0275 |
| | | | 430/5 |
| 2016/0377975 A1* | 12/2016 | Matsumoto | G03F 1/58 |
| | | | 430/5 |
| 2018/0129130 A1* | 5/2018 | Shishido | C23C 14/0682 |
| 2019/0302604 A1* | 10/2019 | Horigome | G03F 1/0061 |

FOREIGN PATENT DOCUMENTS

| | | |
|---|---|---|
| JP | 2004-537758 A | 12/2004 |
| JP | 2010-217514 A | 9/2010 |
| JP | 2011-150202 A | 8/2011 |
| JP | 2015-008283 A | 1/2015 |
| JP | 2016-018192 A | 2/2016 |
| JP | 2016-020949 A | 2/2016 |
| JP | 2016-020950 A | 2/2016 |

\* cited by examiner

MASK BLANK, TRANSFER MASK, METHOD FOR MANUFACTURING TRANSFER MASK, AND METHOD FOR MANUFACTURING SEMICONDUCTOR DEVICE

TECHNICAL FIELD

This invention relates to a mask blank, a transfer mask manufactured by using the mask blank, and a method of manufacturing the transfer mask. This invention also relates to a method of manufacturing a semiconductor device including using the transfer mask.

BACKGROUND ART

In a manufacturing process for a semiconductor device, a fine pattern is formed by a photolithography method. In forming the fine pattern, a large number of transfer masks are generally used. In order to form a finer pattern in the semiconductor device, there is a need to form a finer mask pattern in each of the transfer masks. Besides, there is also a need to use an exposure light source having a shorter wavelength in photolithography. In recent years, an ArF excimer laser (wavelength: 193 nm) has been increasingly applied to an exposure light source at the time of manufacturing the semiconductor device.

The transfer mask generally has a configuration of including a thin film having a transfer pattern on a transparent substrate. In Patent Document 1, there is a disclosure of a photomask (transfer mask) in which a molybdenum silicide (MoSi)-based material is applied to a thin film. However, as disclosed in Patent Document 1, in recent years, it has been found that a MoSi-based film has low fastness to ArF excimer laser exposure light (so-called "ArF light fastness").

Meanwhile, in Patent Document 2, there is a disclosure of a phase shift mask including a SiNx phase shift film, and in Patent Document 3, there is described that a phase shift film formed of a SiN-based material has been confirmed to have high ArF light fastness. Further, in Patent Document 4, there is a disclosure of a defect repair technology involving, while supplying a xenon difluoride (XeF$_2$) gas to an opaque defect portion of a light-shielding film, irradiating the opaque defect portion with an electron beam to etch the opaque defect portion, to thereby remove the opaque defect portion (such defect repair performed through irradiation with charged particles, such as an electron beam, is hereinafter referred to simply as "EB defect repair").

PRIOR ART DOCUMENT(S)

Patent Document(s)

Patent Document 1: JP 2010-217514 A
Patent Document 2: JP 8-220731 A
Patent Document 3: JP 2016-18192 A
Patent Document 4: JP 2004-537758 A

SUMMARY OF THE INVENTION

Problem to be Solved by the Invention

As disclosed in Patent Document 3, a thin film formed of a SiN-based material has high ArF light fastness. While the thin film formed of a SiN-based material was applied as the phase shift film of the phase shift mask in Patent Document 3, the inventors of this invention made investigations into application of the thin film formed of a SiN-based material as a light-shielding film of a binary mask. Optical characteristics required for the light-shielding film are largely different from optical characteristics required for the phase shift film. It is considered that the light-shielding film preferably satisfies a predetermined optical density with a smaller thickness. In view of the foregoing, the inventors made investigations into application of a thin film formed of a SiN-based material having a single layer structure in which the content of nitrogen was reduced to the extent possible as the light-shielding film. However, it was found that a mask blank including such light-shielding film caused a problem in that, at the time of performing EB defect repair on an opaque defect portion of the light-shielding film in the course of manufacturing a transfer mask by using the mask blank, it was not easy to detect an etching end point in detection of a boundary between the light-shielding film and a transparent substrate.

In the EB defect repair, when an opaque defect is irradiated with an electron beam, at least one of Auger electrons, secondary electrons, characteristic X-rays, or backscattered electrons emitted from a portion subjected to the irradiation are detected, and an end point of the repair is detected by observing their changes. For example, when Auger electrons emitted from the portion subjected to irradiation with an electron beam are detected, mainly a change in material composition is observed by Auger electron spectroscopy (AES). In addition, when secondary electrons are detected, mainly a change in surface shape is observed based on a scanning electronic microscope (SEM) image. Further, when characteristic X-rays are detected, mainly a change in material composition is observed by energy dispersive X-ray spectroscopy (EDX) or wavelength dispersive X-ray spectroscopy (WDX). When backscattered electrons are detected, mainly a change in material composition or in crystal state is observed by electron backscatter diffraction (EBSD).

As disclosed in Patent Document 3, when the EB defect repair is performed on the phase shift mask including a pattern of the SiNx phase shift film, it is judged that an end point between the phase shift film and a transparent substrate is detected when a change from a reduction in detection intensity of nitrogen to an increase in detection intensity of oxygen is observed in association with the progress of the repair in a film thickness direction. However, the detection of nitrogen and oxygen is liable to be affected by disturbances, though a treatment chamber is in an almost vacuum state at the time of EB defect repair. In the case of the phase shift film formed of a SiN-based material, it is difficult to obtain a detection intensity of nitrogen at the time of EB defect repair when the phase shift film has a small content of nitrogen. Similarly, also in the case of the light-shielding film formed of a SiN-based material having a single layer structure in which the content of nitrogen is reduced, the detection intensity of nitrogen at the time of EB defect repair is low, and it is not easy to detect an end point.

In consideration of the above-mentioned problem, the inventors of this invention made investigations into a light-shielding film having a two layer structure including a layer formed of silicon nitride having a large content of nitrogen and a layer formed of silicon nitride having a small content of nitrogen. As a result, sensitivity of the detection of an end point at the time of EB defect repair was able to be increased. However, when the shape of a side wall of the light-shielding film at a site subjected to the EB defect repair was observed, a side wall of the layer having a small content of nitrogen was eroded and removed deeply as compared to a side wall of the layer having a large content of nitrogen.

That is, a large step occurred in the shape of a side wall of a pattern of the light-shielding film at the site subjected to the EB defect repair. Such large step leads to a reduction in critical dimension (CD) accuracy of the pattern of the light-shielding film, and hence poses a problem.

This invention has been made to solve the above-mentioned problems, and an object of this invention is to provide a mask blank including a light-shielding film on a transparent substrate in which, even when the light-shielding film has a laminate structure of a high nitrided layer formed of a SiN-based material having a large content of nitrogen and a low nitrided layer formed of a SiN-based material having a small content of nitrogen, the occurrence of a step is reduced in the shape of a side wall of a pattern of the light-shielding film at a site subjected to EB defect repair.

Another object of this invention is to provide a transfer mask manufactured by using the mask blank.

Still another object of this invention is to provide a method of manufacturing the transfer mask.

Further still another object of this invention is to provide a method of manufacturing a semiconductor device including using the transfer mask.

Means to Solve the Problem

In order to solve the above-mentioned problems, this invention has the following configurations.

(Configuration 1)

A mask blank, comprising a light-shielding film on a transparent substrate, wherein the light-shielding film has an optical density for ArF excimer laser exposure light of 2.5 or more, wherein the light-shielding film has a structure including three or more laminate structures of a high nitrided layer and a low nitrided layer, wherein the high nitrided layer and the low nitrided layer are each formed of a material including silicon and nitrogen, or a material including the material and one or more elements selected from metalloid elements and non-metallic elements, wherein the high nitrided layer has a content of nitrogen of 50 atom % or more, and has a thickness of 10 nm or less, wherein the low nitrided layer has a content of nitrogen of less than 50 atom %, and wherein a thickness of the low nitrided layer is twice or more as large as the thickness of the high nitrided layer.

(Configuration 2)

The mask blank according to configuration 1, wherein the high nitrided layer and the low nitrided layer are formed of the same constituent elements.

(Configuration 3)

The mask blank according to configuration 1 or 2, wherein the high nitrided layer and the low nitrided layer are each formed of the material including silicon and nitrogen.

(Configuration 4)

The mask blank according to any one of configurations 1 to 3, wherein, in each of the laminate structures, the high nitrided layer and the low nitrided layer are laminated in the stated order from a transparent substrate side.

(Configuration 5)

The mask blank according to any one of configurations 1 to 4, wherein the light-shielding film comprises, at a position farthest from the transparent substrate, an uppermost layer formed of a material including silicon, nitrogen, and oxygen, or a material including the material and one or more elements selected from metalloid elements and non-metallic elements.

(Configuration 6)

The mask blank according to any one of configurations 1 to 5, further comprising a hard mask film on the light-shielding film.

(Configuration 7)

A transfer mask, comprising a light-shielding film having a transfer pattern on a transparent substrate, wherein the light-shielding film has an optical density for ArF excimer laser exposure light of 2.5 or more, wherein the light-shielding film has a structure including three or more laminate structures of a high nitrided layer and a low nitrided layer, wherein the high nitrided layer and the low nitrided layer are each formed of a material including silicon and nitrogen, or a material including the material and one or more elements selected from metalloid elements and non-metallic elements, wherein the high nitrided layer has a content of nitrogen of 50 atom % or more, and has a thickness of 10 nm or less, wherein the low nitrided layer has a content of nitrogen of less than 50 atom %, and wherein a thickness of the low nitrided layer is twice or ore as large as the thickness of the high nitrided layer.

(Configuration 8)

The transfer mask according to configuration 7, wherein the high nitrided layer and the low nitrided layer are formed of the same constituent elements.

(Configuration 9)

The transfer mask according to configuration 7 or 8, wherein the high nitrided layer and the low nitrided layer are each formed of the material including silicon and nitrogen.

(Configuration 10)

The transfer mask according to any one of configurations 7 to 9, wherein, in each of the laminate structures, the high nitrided layer and the low nitrided layer are laminated in the stated order from a transparent substrate side.

(Configuration 11)

The transfer mask according to any one of configurations 7 to 10, wherein the light-shielding film comprises; at a position farthest from the transparent substrate, an uppermost layer formed of a material including silicon; nitrogen; and oxygen, or a material including the material and one or more elements selected from metalloid elements and non-metallic elements.

(Configuration 12)

A method of manufacturing a transfer mask including using the mask blank according to configuration 6, the method comprising the steps of;

forming a transfer pattern on the hard mask film through dry etching;

forming a transfer pattern on the light-shielding film through dry etching using the hard mask film having the transfer pattern as a mask; and removing the hard mask film.

(Configuration 13)

A method of manufacturing a semiconductor device, comprising the step of exposure-transferring a transfer pattern on a resist film on a semiconductor substrate by using the transfer mask according to any one of configurations 7 to 11.

(Configuration 14)

A method of manufacturing a semiconductor device, comprising the step of exposure-transferring a transfer pattern on a resist film on a semiconductor substrate by using a transfer mask manufactured by the method of manufacturing a transfer mask according to configuration 12.

Effect of the Invention

In the mask blank of this invention, the light-shielding film has a structure including three or more laminate structures of a high nitrided layer and a low nitrided layer, the high nitrided layer and the low nitrided layer are each formed of a material including silicon and nitrogen, or a material including the material and one or more elements selected from metalloid elements and non-metallic elements, the high nitrided layer has a content of nitrogen of 50 atom % or more, and has a thickness of 10 nm or less, the low nitrided layer has a content of nitrogen of less than 50 atom %, and a thickness of the low nitrided layer is twice or more as large as the thickness of the high nitrided layer. When the mask blank has such structure, while the ArF light fastness of the light-shielding film is increased, an end point between the light-shielding film and the transparent substrate can be easily detected at the time of performing EB defect repair on the light-shielding film, and the occurrence of a step can be reduced in the shape of a side wall of a pattern of the light-shielding film at a site subjected to the EB defect repair.

In addition, in the transfer mask of this invention, the light-shielding film having a transfer pattern has the same configuration as the light-shielding film of the mask blank of this invention. When the transfer mask has such structure, while the ArF light fastness of the light-shielding film is increased, even when EB defect repair is performed on an opaque defect portion of the light-shielding film in the course of manufacturing the transfer mask, an end point of the opaque defect portion is easily detected, and excessive digging into a surface of the transparent substrate in the vicinity of the opaque defect portion can be prevented. In addition, the occurrence of a step can be reduced in the shape of a side wall of a pattern of the light-shielding film at a site subjected to the EB defect repair. Therefore, the transfer mask of this invention has high transfer accuracy.

MODES FOR EMBODYING THE INVENTION

Figure 1:
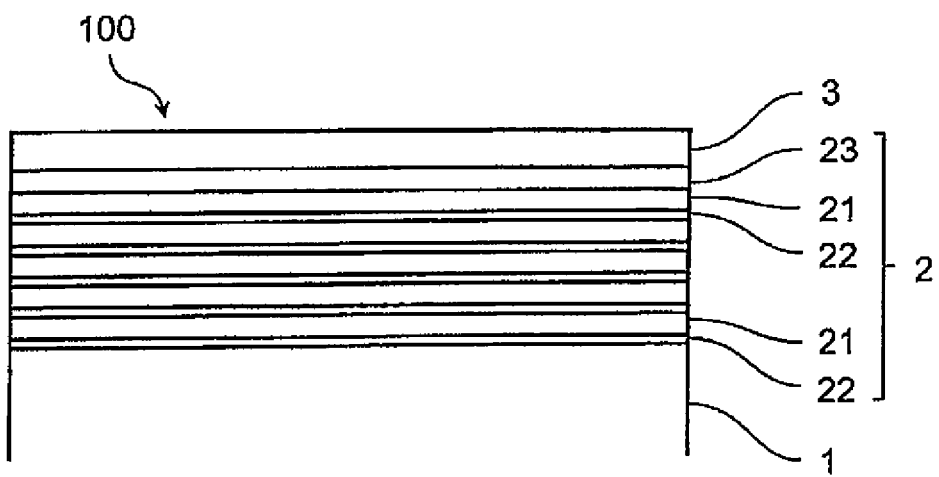
FIG. 1 is a sectional view for illustrating a configuration of a mask blank according to an embodiment of this invention.

First, the background leading to the completion of this invention is described. The inventors of this invention have made extensive investigations into, when a light-shielding film of a mask blank has a laminate structure of a high nitrided layer formed of a SiN-based material having a large content of nitrogen (having a content of nitrogen of 50 atom % or more) and a low nitrided layer formed of a SiN-based material having a small content of nitrogen (having a content of nitrogen of less than 50 atom %) so that, while the ArF light fastness of the light-shielding film is significantly increased, an end point between the light-shielding film and a transparent substrate is easily detected at the time of EB defect repair, a method for reducing the occurrence of a step in the shape of a side wall of a pattern of the light-shielding film at a site subjected to the EB defect repair.

First, a high nitrided layer formed of a SiN-based material having a large content of nitrogen formed under the film formation conditions of a poison mode and a low nitrided layer formed of a SiN-based material having a small content of nitrogen formed under the film formation conditions of a metallic mode were each measured for a repair rate in the EB defect repair (thickness of a layer to be repaired/repair time period=repair amount of the layer to be repaired per unit time (thickness of the layer to be repaired to be removed per unit time), the same applies hereinafter). Specifically, only a SiN film having a large content of nitrogen was formed on a transparent substrate under the film formation conditions of a poison mode, the EB defect repair was performed on the SiN film, and the repair rate of the high nitrided layer was measured. Next, only a SiN film having a small content of nitrogen was formed on another transparent substrate under the film formation conditions of a metallic mode, the EB defect repair was performed on the SiN film, and the repair rate of the low nitrided layer was measured. As a result, it has been found that the repair rate of the low nitrided layer formed of a SiN-based material having a small content of nitrogen is much higher than the repair rate of the high nitrided layer formed of a SiN-based material having a large content of nitrogen.

The EB defect repair performed on a silicon-based material film utilizes the following mechanism: a gas in an unexcited state, such as $XeF_2$, is adsorbed onto an opaque defect portion of the film, fluorine in the gas is separated therefrom to form a fluoride of silicon having a relatively low boiling point, and the fluoride is volatilized. In the EB defect repair, an electron beam is irradiated to a thin film at the opaque defect portion to excite silicon at the opaque defect portion. With this, silicon at the opaque defect portion forms the fluoride more easily than silicon at a portion other than the opaque defect portion, and is volatilized preferentially. Thus, an opaque defect can be removed.

In the EB defect repair, the opaque defect portion is removed from the surface of the light-shielding film toward an interface between the light-shielding film and the transparent substrate. At the time of EB defect repair, while a fluorine-based gas in an unexcited state is supplied to the opaque defect portion, the fluorine-based gas is inevitably supplied around the opaque defect portion. Therefore, the fluorine-based gas in an unexcited state is adsorbed not only onto the surface of the light-shielding film at the opaque defect portion but also onto a side wall of a pattern of the light-shielding film. In addition, at the time of EB defect repair, the surface of the light-shielding film at the opaque defect portion is irradiated with an electron beam to excite silicon in the vicinity of the surface most efficiently, but excite silicon in a region on a side wall side to some extent.

When the EB defect repair is performed on an opaque defect portion of a pattern of the light-shielding film in which the high nitrided layer and the low nitrided layer each formed of a SiN-based material are laminated on the transparent substrate in the stated order, an electron beam is irradiated to a surface of the low nitrided layer, and hence the opaque defect portion is removed preferentially in a direction from the surface of the low nitrided layer toward an interface between the low nitrided layer and the high nitrided layer (in a layer thickness direction). After the low nitrided layer at the opaque defect portion is removed, a surface of the high nitrided layer to be irradiated with the electron beam is preferentially removed. At this time, the fluorine-based gas in an unexcited state is also adsorbed onto a side wall of a pattern of the low nitrided layer after the removal of the opaque defect portion. A portion of the low nitrided layer onto which the fluorine-based gas is adsorbed is strongly affected by the electron beam, and is hence liable to be in a state in which silicon is excited to some extent. Therefore, the side wall of the pattern of the low nitrided layer exposed after the removal of the opaque defect portion is inevitably and unintentionally continued to be removed from the side wall to an inside of the pattern until the EB defect repair of the light-shielding film at the opaque defect portion is completed, albeit at a lower repair rate than a repair rate in the layer thickness direction. It is considered that, when the EB defect repair is performed on the opaque defect portion of the pattern of the light-shielding film having a laminate structure of the high nitrided layer and the low nitrided layer each formed of a SiN-based material, a step occurs on the side wall of the pattern by the above-mentioned mechanism.

In consideration of the mechanism in which the side wall of the pattern of the low nitrided layer is excessively removed at the time of performing the EB defect repair on the opaque defect portion of the light-shielding film, it can be said that, when a time period for which the opaque defect portion of the light-shielding-film is removed by the EB defect repair can be shortened, a time period for which the side wall of the pattern of the low nitrided layer is continued to be removed is shortened, and the occurrence of a step can be reduced on the side wall of the pattern of the light-shielding film after the EB defect repair. From the above-mentioned results of the investigations, it has already been found that the repair rate of the high nitrided layer formed of a SiN-based material having a large content of nitrogen is much lower than the repair rate of the low nitrided layer formed of a SiN-based material having a small content of nitrogen. In view of the foregoing, the inventors of this invention have made investigations into a method for increasing the repair rate of the high nitrided layer formed of a SiN-based material. As a result, it has been found that a light-shielding film having three laminate structures (six layer structure) of the low nitrided layer and the high nitrided layer has an obviously higher repair rate in the EB defect repair than a light-shielding film having a laminate structure (two layer structure) of the low nitrided layer and the high nitrided layer.

Based on the fact that the thickness of the high nitrided layer of the light-shielding film having the two layer structure and the total thickness of the three high nitrided layers of the light-shielding film having the six layer structure showed little difference, and the fact that the thickness of the low nitrided layer of the light-shielding film having the two layer structure and the total thickness of the three low nitrided layers of the light-shielding film having the six layer structure showed little difference, there was supposed to be little difference in repair rate in the EB defect repair between the light-shielding film having the two layer structure and the light-shielding film having the six layer structure on calculation. In light of the result, a light-shielding film having two laminate structures (four layer structure) of the high nitrided layer and the low nitrided layer was formed on a transparent substrate so that the total thickness of the high nitrided layers and the total thickness of the low nitrided layers were adjusted to be almost the same as in the light-shielding films having the two layer structure and the six layer structure. The light-shielding film was subjected to the EB defect repair, and measured for a repair rate in the EB defect repair. As a result, a difference in repair rate in the EB defect repair between the light-shielding film having the four layer structure and the light-shielding film having the two layer structure was significantly small, and fell short of reaching a remarkable difference in repair rate in the EB defect repair between the light-shielding film having the six layer structure and the light-shielding film having the four layer structure. The light-shielding film having the four layer structure and the light-shielding film having the six layer structure are scarcely different from each other except for the thickness of the high nitrided layer and the thickness of the low nitrided layer.

In light of the above-mentioned results, the inventors of this invention have made investigations into optimal conditions of the thicknesses of the high nitrided layer and the low nitrided layer in the light-shielding film having a structure including three or more laminate structures of the high nitrided layer and the low nitrided layer. As a result, the inventors have reached a conclusion that, when the thickness of the high nitrided layer is set to 10 nm or less, and the thickness of the low nitrided layer is set to be twice or more as large as the thickness of the high nitrided layer, the occurrence of a step can be reduced on the side wall of the pattern at the time of EB defect repair, and the entire thickness of the light-shielding film can be reduced to such a thickness that a fine pattern can be formed on the light-shielding film while desired light shielding performance (optical density) of the light-shielding film is ensured.

That is, a mask blank of this invention includes a light-shielding film on a transparent substrate, wherein the light-shielding film has an optical density for ArF excimer laser exposure light of 2.5 or more, wherein the light-shielding film has a structure including three or more laminate structures of a high nitrided layer and a low nitrided layer, wherein the high nitrided layer and the low nitrided layer are each formed of a material including silicon and nitrogen, or a material including the material and one or more elements selected from metalloid elements and non-metallic elements, wherein the high nitrided layer has a content of nitrogen of 50 atom % or more, and has a thickness of 10 nm or less, wherein the low nitrided layer has a content of nitrogen of less than 50 atom %, and wherein a thickness of the low nitrided layer is twice or more as large as the thickness of the high nitrided layer.

The inventors of this invention have considered the reason why the repair rate of the light-shielding film having the above-mentioned configuration in the EB defect repair is increased, and as a result, have presumed as described below. The presumption described below is based on surmise made by the inventors at the time of filing of this invention, and by no means limits the scope of this invention. It is considered that, in the mask blank including the light-shielding film, a thin film for forming a pattern most preferably has an amorphous structure for the reasons that, for example, satisfactory pattern edge roughness is achieved when a pattern is formed through etching. When the thin film has such a composition that the amorphous structure is difficult to obtain, a state in which the amorphous structure and a microcrystalline structure are mixed is achieved in some cases.

The EB defect repair performed on a silicon-based material film utilizes the following mechanism: fluorine in a gas in an unexcited state, such as $XeF_2$, is adsorbed onto an opaque defect portion of the film, and is separated therefrom to form a fluoride of silicon having a relatively low boiling point, and the fluoride is volatilized. In the EB defect repair, a thin film at the opaque defect portion is irradiated with an electron beam to excite silicon at the opaque defect portion. With this, silicon at the opaque defect portion forms the fluoride more easily than silicon at a portion other than the opaque defect portion, and is volatilized preferentially. Thus, an opaque defect can be removed. In the EB defect repair, there is a tendency that silicon in the opaque defect portion forms the fluoride more easily and the opaque defect portion is removed more easily when silicon in the opaque defect portion does not have a crystalline structure, that is, has an amorphous structure.

The low nitrided layer of the light-shielding film has a content of nitrogen of less than 50 atom %, and hence it is considered that a ratio of silicon having an amorphous structure in the low nitrided layer is relatively high as compared to that in the high nitrided layer having a content of nitrogen of 50 atom % or more. Therefore, it is considered that the repair rate of the low nitrided layer in the EB defect repair is much higher than that of the high nitrided layer, even though the low nitrided layer and the high nitrided layer are formed of the same silicon nitride-based material. Meanwhile, in the high nitrided layer having a content of nitrogen of 50 atom % or more, a ratio of silicon having a microcrystalline structure in the layer is relatively high.

The light-shielding film of this invention having a six layer structure includes at least two high nitrided layers each sandwiched between two low nitrided layers. The sandwiched high nitrided layers are each formed by causing sputtering particles to enter a surface of the lower low nitrided layer and deposit thereon by a sputtering method. At this time, a mixed region in which constituent elements of the low nitrided layer and constituent elements of the high nitrided layer are mixed is formed between the lower low nitrided layer and the high nitrided layer, albeit having a significantly small thickness (from about 0.1 nm to about 2 nm). A ratio of silicon having an amorphous structure is higher in the mixed region than in the high nitrided layer. Similarly, when the upper low nitrided layer is formed by the sputtering method under a state in which the high nitrided layer has been formed, a mixed region is also formed between the high nitrided layer and the upper low nitrided layer. A ratio of silicon having an amorphous structure is higher in each of those mixed regions than in the high nitrided layer, and hence it is considered that each of the mixed regions has a higher repair rate in the EB defect repair than the high nitrided layer. The thicknesses of those mixed regions do not largely change with changes in thicknesses of the high nitrided layer and the low nitrided layer. The thicknesses of those mixed regions are somewhat increased when the light-shielding film is subjected to heat treatment or light irradiation treatment described below.

In the light-shielding film having the four layer structure, the number of the low nitrided layers and the high nitrided layers brought into contact with each other is smaller, and hence the number of the mixed regions to be formed is smaller than in the light-shielding film having the six layer structure. Even when the total thickness of the high nitrided layers in the light-shielding film having the six layer structure and the total thickness of the high nitrided layers in the light-shielding film having the four layer structure are the same, the total thickness of the high nitrided layers excluding the mixed regions is much smaller in the light-shielding film having the six layer structure than in the light-shielding film having the four layer structure. Therefore, it is presumed that a time period for which the total thickness of the high nitrided layers excluding the mixed regions is removed through the EB defect repair is much shorter in the light-shielding film having the six layer structure than in the light-shielding film having the four layer structure.

Next, embodiments of this invention are described. FIG. 1 is a sectional view for illustrating a configuration of a mask blank 100 according to an embodiment of this invention. The mask blank 100 illustrated in FIG. 1 has a structure in which a light-shielding film 2 and a hard mask film 3 are laminated on a transparent substrate 1 in the stated order.

The transparent substrate 1 may be formed of synthetic quartz glass, or as well, quartz glass, aluminosilicate glass, soda lime glass, low-thermal-expansion glass (e.g., $SiO_2$—$TiO_2$ glass), or the like. Of those, synthetic quartz glass is particularly preferred as a material for forming the transparent substrate of the mask blank because of having a high transmittance to ArF excimer laser light (wavelength: 193 nm).

The light-shielding film 2 is required to have an optical density for ArF excimer laser exposure light (hereinafter referred to as "ArF exposure light") of 2.5 or more in order to satisfy light shielding performance required for a pattern of a light-shielding film of a binary mask. The light-shielding film 2 has an optical density for ArF exposure light of preferably 2.8 or more, more preferably 3.0 or more.

The light-shielding film 2 of this invention at least has a structure (six layer structure) including three or more laminate structures of a high nitrided layer 22 and a low nitrided layer 21. The light-shielding film 2 illustrated in FIG. 1 includes five laminate structures of the high nitrided layer 22 and the low nitrided layer 21. The light-shielding film 2 has a structure including the five laminate structures in each of which the high nitrided layer 22 and the low nitrided layer 21 are laminated in the stated order from a transparent substrate 1 side, and further including an uppermost layer 23 laminated on the uppermost low nitrided layer 21.

The high nitrided layer 22 and the low nitrided layer 21 are each formed of a material including silicon and nitrogen, or a material including the material including silicon and nitrogen; and one or more elements selected from metalloid elements and non-metallic elements. The high nitrided layer 22 and the low nitrided layer 21 are each free of a transition metal, which may become a factor in reducing light fastness to the ArF exposure light. In addition, the high nitrided layer 22 and the low nitrided layer 21 are each desirably free of a metal element other than the transition metal because the possibility that the metal element also becomes a factor in reducing light fastness to the ArF exposure light cannot be denied. The high nitrided layer 22 and the low nitrided layer 21 may each include any metalloid element in addition to silicon. Examples of the metalloid element include boron, silicon, germanium, arsenic, antimony, and tellurium. Of those metalloid elements, one or more elements selected from boron, germanium, antimony, and tellurium are preferably incorporated because an increase in conductivity of silicon to be used as a sputtering target can be expected.

The high nitrided layer 22 and the low nitrided layer 21 may each include any non-metallic element in addition to nitrogen. As used herein, the "non-metallic elements" refer to elements including non-metallic elements in a narrow sense (nitrogen, carbon, oxygen, phosphorus, sulfur, and selenium), and halogens and noble gases. Of those non-metallic elements, one or more elements selected from carbon, fluorine, and hydrogen are preferably incorporated. In each of the high nitrided layer 22 and the low nitrided layer 21, the content of oxygen is suppressed to preferably 10 atom % or less, more preferably 5 atom % or less. It is still more preferred that oxygen be not positively incorporated in each of the high nitrided layer 22 and the low nitrided layer 21 (oxygen be incorporated at a lower detection limit or less when composition analysis is performed by, for example, X-ray photoelectron spectroscopy). When oxygen is incorporated in a film formed of a silicon nitride-based material, an extinction coefficient k tends to be significantly reduced, resulting in an increase in entire thickness of the light-shielding film 2. In addition, in each of the high nitrided layer 22 and the low nitrided layer 21, the total content of silicon and nitrogen is preferably 97 atom % or more, more preferably 98 atom % or more.

The transparent substrate 1 is generally formed of a material containing $SiO_2$ as a main component, such as synthetic quartz glass. When any one of the high nitrided layer 22 and the low nitrided layer 21 each including oxygen is formed so as to be brought into contact with a surface of the transparent substrate 1, a difference between the composition of a film formed of a silicon nitride-based material including oxygen and the composition of glass is reduced. With this, in some cases, there is a problem in that, when dry etching with a fluorine-based gas is performed for forming a pattern on the light-shielding film 2, it is difficult to obtain etching selectivity between a layer brought into contact with the transparent substrate 1 (the high nitrided layer 22 or the low nitrided layer 21) and the transparent substrate 1.

The high nitrided layer 22 and the low nitrided layer 21 may each include a noble gas. The noble gas is an element capable of increasing a film formation speed and thus improving productivity when existing in a film formation chamber at the time of forming a thin film by reactive sputtering. When the noble gas is converted into plasma and collides with a target, a constituent element of the target flies out of the target, and is laminated on the transparent substrate 1 to form a thin film while a reactive gas is incorporated therein on the way. During a time period after the constituent element of the target flies out of the target until the constituent element of the target adheres onto the transparent substrate, the noble gas in the film formation chamber is slightly incorporated therein. Preferred examples of the noble gas required for the reactive sputtering include argon, krypton, and xenon. In addition, in order to relax a stress in the thin film, helium and neon each having a small atomic weight may be positively incorporated in the thin film.

The high nitrided layer 22 needs to have a content of nitrogen of 50 atom % or more. Such high nitrided layer 22 exhibits a high detection intensity of nitrogen at the time of detection of an end point in the EB defect repair, and hence an end point between the high nitrided layer and the transparent substrate including silicon oxide as a main component is easily detected. The high nitrided layer 22 preferably has a content of nitrogen of 52 atom % or more. In addition, the high nitrided layer 22 has a content of nitrogen of preferably 57 atom % or less, more preferably 55 atom % or less.

The low nitrided layer 21 needs to have a content of nitrogen of less than 50 atom %. The reason for this is that light shielding performance required for the light-shielding film 2 is ensured with a smaller entire thickness. The low nitrided layer 21 has a content of nitrogen of preferably 48 atom % or less, more preferably 45 atom % or less. In addition, the low nitrided layer 21 has a content of nitrogen of preferably 20 atom % or more, more preferably 25 atom % or more. Meanwhile, considering that a difference in repair rate between the low nitrided layer 21 and the high nitrided layer 22 is prevented from being excessively increased at the time of EB defect repair, the low nitrided layer 21 desirably has a content of nitrogen of 20 atom % or more.

The high nitrided layer 22 and the low nitrided layer 21 are preferably formed of the same constituent elements. When any one of the high nitrided layer 22 and the low nitrided layer 21 includes a different constituent element, and the high nitrided layer 22 and the low nitrided layer 21 are subjected to heat treatment or light irradiation treatment, or irradiated with ArF exposure light under a state of being brought into contact with each other, there is a risk in that the different constituent element moves to the other layer not including the constituent element and diffuses thereinto. Moreover, there is a risk in that the optical characteristics of the high nitrided layer 22 and the low nitrided layer 21 largely differ from their original characteristics at the time of film formation. In addition, particularly when the different constituent element is a metalloid element, the high nitrided layer 22 and the low nitrided layer 21 need to be formed by using different targets.

The high nitrided layer 22 and the low nitrided layer 21 are each preferably formed of a material including silicon and nitrogen. The noble gas is an element which is difficult to detect even when a thin film is subjected to composition analysis by, for example, Rutherford backscattering spectrometry (RBS) or X-ray photoelectron spectroscopy (XPS). Therefore, the material including silicon and nitrogen can be regarded as including a material including a noble gas.

The high nitrided layer 22 needs to have a thickness of 10 nm or less. When the thickness of the high nitrided layer 22 is set to 10 nm or less, the repair rate of the high nitrided layer 22 in the EB defect repair can be increased. The high nitrided layer 22 has a thickness of preferably 9 nm or less, more preferably 8 nm or less. Meanwhile, the high nitrided layer 22 has a thickness of preferably 2 nm or more, more preferably 3 nm or more. When the thickness of the high nitrided layer 22 is less than 2 nm, there is a risk in that, at the time of detection of an end point in the EB defect repair, the detection intensity of nitrogen in the high nitrided layer 22 is reduced.

The thickness of the low nitrided layer 21 needs to be twice or more as large as the thickness of the high nitrided layer 22. In order to ensure light shielding performance required for the light-shielding film 2 with a smaller entire thickness, the thickness of the low nitrided layer 21, which has relatively high light shielding performance, needs to be set to be twice or more as large as the thickness of the high nitrided layer 22, which has relatively low light shielding performance. Meanwhile, the thickness of the low nitrided layer 21 is preferably ten times or less, more preferably eight times or less, still more preferably five times or less as large as the thickness of the high nitrided layer 22. This is because, at the time of EB defect repair, the low nitrided layer 21 may be eroded more deeply on a side wall of a pattern of the light-shielding film 2.

The number of the laminate structures of the high nitrided layer 22 and the low nitrided layer 21 in the light-shielding film 2 needs to be three or more (a total number of the layers: six or more). The number of the laminate structures is more preferably four or more (a total number of the layers: eight or more). In addition, the number of the laminate structures of the high nitrided layer 22 and the low nitrided layer 21 in the light-shielding film 2 is preferably 10 or less (a total number of the layers: 20 or less), more preferably nine or less (a total number of the layers: 18 or less), still more preferably eight or less (a total number of the layers: 16 or less). As described above, the minimum thickness required for the high nitrided layer 22 is determined from the viewpoint of the detection of an end point at the time of EB defect repair. Therefore, when the number of the laminate structures is 10 or more, a ratio of the high nitrided layers 22 to the entire thickness of the light-shielding film 2 is increased. In this case, the desired light shielding performance cannot be ensured while the entire thickness of the light-shielding film 2 is reduced. The high nitrided layers 22 and the low nitrided layers 21 of the respective laminate structures of the light-shielding film 2 may have the same thickness or different thicknesses.

In the high nitrided layer 22, the existence ratio of a microcrystalline structure having a Si—N bond is higher than in the low nitrided layer 21. In addition, in the low nitrided layer 21, the existence ratio of Si having an amorphous structure is higher than in the high nitrided layer 22. Therefore, in the mixed region formed between the high nitrided layer 22 and the low nitrided layer 21, the existence ratio of Si having an amorphous structure is higher than in a region of the high nitrided layer 22 excluding the mixed region. In addition, in the mixed region, the existence ratio of the microcrystalline structure having a Si—N bond is lower than in the region of the high nitrided layer 22 excluding the mixed region. The mixed region having such internal structure exhibits a higher repair rate in the EB defect repair than the high nitrided layer 22. The thickness of the mixed region preferably falls within a range of 0.1 nm or more and 2 nm or less.

The light-shielding film 2 preferably has a structure in which the high nitrided layer 22 and the low nitrided layer 21 are laminated on each other while being brought into direct contact with each other without intermediation of any other film. With this, the mixed region can be formed between the high nitrided layer 22 and the low nitrided layer 21, to thereby increase the repair rate of the light-shielding film 2 in the EB defect repair.

From the viewpoint of performing the EB defect repair on the light-shielding film 2, it is preferred for the laminate structure of the high nitrided layer 22 and the low nitrided layer 21 that the high nitrided layer 22 and the low nitrided layer 21 be laminated in the stated order from the transparent substrate 1 side. The transparent substrate 1 is formed of a material containing silicon oxide as a main component. In the case where the EB defect repair is performed on the light-shielding film 2 formed of a silicon nitride-based material, it is judged that an etching end point between the light-shielding film 2 and the transparent substrate 1 is detected when a change from a reduction in detection intensity of nitrogen to an increase in detection intensity of oxygen is observed in association with the progress of etching. In consideration of this point, it is advantageous for the detection of an etching end point at the time of EB defect repair to arrange the high nitrided layer 22 having a large content of nitrogen as a layer of the light-shielding film 2 on a side brought into contact with the transparent substrate 1.

Meanwhile, at the time of forming a pattern on the light-shielding film 2 formed of a silicon nitride-based material through dry etching, a fluorine-based gas, such as $SF_6$, exhibiting a relatively low etching rate of the transparent substrate 1 in the dry etching is generally used. In the dry etching using the fluorine-based gas, such as $SF_6$, the high nitrided layer 22 having a larger content of nitrogen can have higher etching selectivity to the transparent substrate 1. From the viewpoint of the dry etching performed on the light-shielding film 2, it is preferred for the laminate structure of the high nitrided layer 22 and the low nitrided layer 21 that the high nitrided layer 22 and the low nitrided layer 21 be laminated in the stated order from the transparent substrate 1 side.

The high nitrided layer 22 is preferably formed of a material having a refractive index n for the ArF exposure light of 2.4 or more (preferably 2.5 or more), and having an extinction coefficient k for the ArF exposure light of less than 1.0 (preferably 0.9 or less, more preferably 0.7 or less, still more preferably 0.4 or less). In addition, the low nitrided layer 21 is preferably formed of a material having a refractive index n of less than 2.2 (preferably 2.1 or less, more preferably 2.0 or less), and having an extinction coefficient k of 1.2 or more (preferably 1.4 or more, more preferably 1.5 or more).

The refractive index n and the extinction coefficient k of a thin film do not depend only on the composition of the thin film. For example, the film density and crystal state of the thin film are also factors affecting the refractive index n and the extinction coefficient k. Therefore, the thin film is formed so as to have a desired refractive index n and a desired extinction coefficient k by adjusting various conditions at the time of forming the thin film by reactive sputtering. The refractive index n and the extinction coefficients k of the high nitrided layer 22 and the low nitrided layer 21 are adjusted to fall within the above-mentioned ranges by, for example, adjusting, at the time of film formation of these layers by reactive sputtering, a ratio in a mixed gas of a noble gas and a reactive gas. The film formation conditions of the reactive sputtering cover a wide variety of conditions including a pressure in a film formation chamber, a power to be applied to a target, and a positional relationship, such as a distance between the target and the transparent substrate. In addition, those film formation conditions are specific to a film formation device, and are appropriately adjusted so that a thin film to be formed has a desired refractive index n and a desired extinction coefficient k.

While the high nitrided layer 22 and the low nitrided layer 21 are each formed by sputtering, any sputtering, such as DC sputtering, RF sputtering, or ion beam sputtering, may be applied. It is preferred to apply RF sputtering or ion beam sputtering in the case of using a target having low conductivity (e.g., a silicon target, or a silicon compound target which is free of a metalloid element or has a small content of a metalloid element). In consideration of a film formation rate, it is more preferred to apply RF sputtering.

A method of manufacturing the mask blank 100 preferably includes a high nitrided layer formation step and a low nitrided layer formation step. In the high nitrided layer formation step, the high nitrided layer 22 is formed on the transparent substrate 1 by reactive sputtering using a silicon target or a target formed of a material including silicon and one or more elements selected from metalloid elements and non-metallic elements and using a sputtering gas including a nitrogen-based gas and a noble gas. In the low nitrided layer formation step, the low nitrided layer 21 is formed on the transparent substrate 1 by reactive sputtering using a silicon target or a target formed of a material including silicon and one or more elements selected from metalloid elements and non-metallic elements and using a sputtering gas including a nitrogen-based gas and a noble gas and having a lower mixing ratio of the nitrogen-based gas than the sputtering gas used in the high nitrided layer formation step.

In addition, in the method of manufacturing the mask blank 100, it is preferred that a so-called poison mode (reactive mode) be selected for the sputtering gas to be used in the high nitrided layer formation step, the poison mode being a mode in which the mixing ratio of the nitrogen-based gas is higher than in the range of the mixing ratio of the nitrogen-based gas in a transition mode in which film formation tends to be unstable, and that a so-called metallic mode be selected for the sputtering gas to be used in the low nitrided layer formation step, the metallic mode being a mode in which the mixing ratio of the nitrogen-based gas is lower than in the range of the mixing ratio of the nitrogen-based gas in the transition mode. Matters concerning the poison mode, the transition mode, and the reactive mode are the same as in the case of forming a high nitrided layer and a low nitrided layer of the phase shift film by sputtering in Patent Document 3.

Any gas containing nitrogen may be applied as the nitrogen-based gas to be used in each of the high nitrided layer formation step and the low nitrided layer formation step. As described above, the content of oxygen in each of the high nitrided layer 22 and the low nitrided layer 21 is preferably suppressed small. Therefore, a nitrogen-based gas free of oxygen is preferably applied, and a nitrogen gas ($N_2$ gas) is more preferably applied. In addition, any noble gas may be applied as the noble gas to be used in each of the high nitrided layer formation step and the low nitrided layer formation step. Preferred examples of the noble gas include argon, krypton, and xenon. In addition, in order to relax a stress in the thin film, helium and neon each having a small atomic weight may be positively incorporated in the thin film, The light-shielding film 2 preferably includes, at a position farthest from the transparent substrate 1, the uppermost layer 23 formed of a material including silicon, nitrogen, and oxygen, or a material including the material and one or more elements selected from metalloid elements and non-metallic elements. A silicon-based material film in which oxygen is not positively incorporated and nitrogen is incorporated tends to have lower chemical resistance than a silicon-based material film in which oxygen is positively incorporated, while having high light fastness to the ArF exposure light.

In the case of the mask blank 100 in which the high nitrided layer 22 or the low nitrided layer 21 in which oxygen is not positively incorporated and nitrogen is incorporated is arranged as the uppermost layer 23 of the light-shielding film 2 on an opposite side to the transparent substrate 1 side, it is difficult to avoid oxidation of a surface layer of the light-shielding film 2 when a transfer mask manufactured from the mask blank 100 is subjected to mask cleaning, or is stored in the air. When the surface layer of the light-shielding film 2 is oxidized, the optical characteristics of a thin film largely differ from its optical characteristics at the time of film formation. Particularly in the case of a configuration in which the low nitrided layer 21 is formed as the uppermost layer 23 of the light-shielding film 2, the light shielding performance is significantly reduced owing to oxidation of the low nitrided layer 21. When the uppermost layer 23 formed of a material including silicon, nitrogen, and oxygen, or a material including the material and one or more elements selected from metalloid elements and non-metallic elements is further formed on the laminate structures of the high nitrided layer 22 and the low nitrided layer 21, surface oxidation of the high nitrided layer 22 and the low nitrided layer 21 can be suppressed.

The uppermost layer 23 formed of a material including silicon, nitrogen, and oxygen, or a material including the material and one or more elements selected from metalloid elements and non-metallic elements has a configuration in which the uppermost layer 23 has almost the same composition in a layer thickness direction, and as well, has a configuration in which the uppermost layer 23 has a gradient composition in the layer thickness direction (a configuration in which the uppermost layer 23 has such a gradient composition that the content of oxygen in the layer is increased with distance from the transparent substrate 1). As a material suitable for the uppermost layer 23 having a configuration in which the uppermost layer 23 has almost the same composition in the layer thickness direction, there are given $SiO_2$ and SiON. The uppermost layer 23 having a configuration in which the uppermost layer 23 has a gradient composition in the layer thickness direction preferably has a configuration in which the uppermost layer 23 is formed of SiN on the transparent substrate 1 side, the content of oxygen is increased with distance from the transparent substrate 1, and a surface layer of the uppermost layer 23 is formed of $SiO_2$ or SiON.

While the uppermost layer 23 is formed by sputtering, any sputtering, such as DC sputtering, RF sputtering, or ion beam sputtering, may be applied. It is preferred to apply RF sputtering or ion beam sputtering in the case of using a target having low conductivity (e.g., a silicon target, or a silicon compound target which is free of a metalloid element or has a small content of a metalloid element). In consideration of a film formation rate, it is more preferred to apply RF sputtering.

In addition, the method of manufacturing the mask blank 100 preferably includes an uppermost layer formation step of forming the uppermost layer 23 at a position of the light-shielding film 2 farthest from the transparent substrate 1 by sputtering using a silicon target, or a target formed of a material including silicon and one or more elements selected from metalloid elements and non-metallic elements and using a sputtering gas including a noble gas. Further, the method of manufacturing the mask blank 100 more preferably includes an uppermost layer formation step of forming the uppermost layer 23 at a position of the light-shielding film 2 farthest from the transparent substrate 1 by reactive sputtering using a silicon target and using a sputtering gas including a nitrogen gas and a noble gas, followed by subjecting at least the surface layer of the uppermost layer 23 to oxidation treatment. In this case, examples of the oxidation treatment to be performed on the surface layer of the uppermost layer 23 include heat treatment in a gas containing oxygen, such as the air, light irradiation treatment with a flash lamp or the like in a gas containing oxygen, such as the air, and treatment involving bringing ozone or oxygen plasma into contact with the uppermost layer 23.

For the formation of the uppermost layer 23, an uppermost layer formation step of forming the uppermost layer 23 by reactive sputtering using a silicon target, or a target formed of a material including silicon and one or more elements selected from metalloid elements and non-metallic elements and using a sputtering gas including a nitrogen gas, an oxygen gas, and a noble gas may be applied. The uppermost layer formation step may be applied to both formation of the uppermost layer 23 having a configuration in which the uppermost layer 23 has almost the same composition in the layer thickness direction and formation of the uppermost layer 23 having a configuration in which the uppermost layer 23 has a gradient composition in the layer thickness direction. In addition, for the formation of the uppermost layer 23, an uppermost layer formation step of forming the uppermost layer 23 by sputtering using a silicon dioxide ($SiO_2$) target, or a target formed of a material including silicon dioxide ($SiO_2$) and one or more elements selected from metalloid elements and non-metallic elements and using a sputtering gas including a noble gas may be applied. Also the uppermost layer formation step may be applied to both formation of the uppermost layer 23 having a configuration in which the uppermost layer 23 has almost the same composition in the layer thickness direction and formation of the uppermost layer 23 having a configuration in which the uppermost layer 23 has a gradient composition in the layer thickness direction.

The mask blank 100 preferably includes the hard mask film 3 on the light-shielding film 2. The light-shielding film 2 needs to have a function of ensuring a predetermined optical density, and hence a reduction in its thickness is limited. The hard mask film 3 only needs to have a thickness enough to function as an etching mask until the completion of dry etching for forming a pattern on the light-shielding film 2 immediately below the hard mask film 3, and is not basically limited depending on the optical characteristics. Therefore, the thickness of the hard mask film 3 can be reduced to be much lower than the thickness of the light-shielding film 2. Moreover, a resist film formed of an organic material only needs to have a thickness enough to function as an etching mask until the completion of dry etching for forming a pattern on the hard mask film 3, and hence the thickness of the resist film can be reduced to be much lower than in the related art, The hard mask film 3 is preferably formed of a material including chromium. Examples of the material including chromium for forming the hard mask film 3 include materials including chromium and one or more elements selected from oxygen, nitrogen, carbon, boron, and fluorine, as well as chrome metal. The thickness of the hard mask film 3 is preferably 20 nm or less, more preferably 15 nm or less. In addition, the thickness of the hard mask film 3 is preferably 2 nm or more, more preferably 3 nm or more.

FIG. 2 includes schematic sectional views for illustrating manufacturing steps for a transfer mask (binary mask) 200 from the mask blank 100 according to the embodiment of this invention.

The transfer mask 200 of this invention is a transfer mask including the light-shielding film 2 having a transfer pattern (light shielding pattern 2a) on the transparent substrate 1, wherein the light-shielding film 2 has an optical density for the ArF excimer laser exposure light of 2.5 or more, wherein the light-shielding film 2 has a structure including three or more laminate structures of the high nitrided layer 22 and the low nitrided layer 21, wherein the high nitrided layer 22 and the low nitrided layer 21 are each formed of a material including silicon and nitrogen, or a material including the material and one or more elements selected from metalloid elements and non-metallic elements, wherein the high nitrided layer 22 has a content of nitrogen of 50 atom % or more, and has a thickness of 10 nm or less, wherein the low nitrided layer 21 has a content of nitrogen of less than 50 atom %, and wherein a thickness of the low nitrided layer 21 is twice or more as large as the thickness of the high nitrided layer 22.

The transfer mask 200 has the same technical features as those of the mask blank 100. Therefore, matters concerning the transparent substrate 1, and the high nitrided layer 22, the low nitrided layer 21, and the uppermost layer 23 of the light-shielding film 2 in the transfer mask 200 are the same as those in the mask blank 100.

In addition, a method of manufacturing the transfer mask 200 of this invention includes using the mask blank 100 described above, and includes the steps of; forming a transfer pattern on the hard mask film 3 through dry etching; forming a transfer pattern on the light-shielding film 2 through dry etching using the hard mask film 3 having the transfer pattern (hard mask pattern 3a) as a mask; and removing the hard mask film 3 having the transfer pattern (hard mask pattern 3a).

Such transfer mask 200 has high ArF light fastness, and a CD change (an increase in pattern width) of the light shielding pattern 2a can be suppressed to fall within a small range even after cumulative irradiation with the ArF excimer laser exposure light. When the transfer mask 200 having a fine pattern corresponding to the DRAM hp 32-nm generation in recent years is to be manufactured, there are few cases in which the light-shielding film 2 has no opaque defect portion in a stage in which the transfer pattern has been formed on the light-shielding film 2 of the mask blank 100 through dry etching. In addition, the EB defect repair is often applied as defect repair performed on an opaque defect portion of the light-shielding film 2 having the fine pattern described above. In the light-shielding film including three or more laminate structures (six or more layer structure) of the low nitrided layer and the high nitrided layer, the number of the mixed regions to be formed is larger (the total thickness of the mixed regions is larger), and a repair rate in the EB defect repair is much higher than in a light-shielding film including one laminate structure (two layer structure) or two laminate structures (four layer structure) of the low nitrided layer and the high nitrided layer. Besides, while the high nitrided layer 22 of the light-shielding film 2 has a low repair rate in the EB defect repair, a repair time period required for the EB defect repair is shortened by setting the thickness of the high nitrided layer to 10 nm or less. Therefore, when the EB defect repair is performed on the opaque defect portion of the light-shielding film 2, the occurrence of a step is sufficiently reduced in the shape of a side wall of a pattern of the light-shielding film 2 after the repair, and the transfer mask 200 after the repair has high transfer accuracy.

Thus, even when the transfer mask 200 in which the EB defect repair has been performed on the opaque defect portion and which has been subjected to cumulative irradiation is set to a mask stage of an exposure apparatus using the ArF excimer laser as exposure light, and the transfer pattern 2a is exposure-transferred onto a resist film on a semiconductor substrate, the pattern can be transferred on the resist film on the semiconductor substrate with such accuracy as to sufficiently satisfy design specifications.

An example of the method of manufacturing the transfer mask 200 is described below according to the manufacturing steps illustrated in FIG. 2.

First, a resist film was formed in contact with the hard mask film 3 of the mask blank 100 by a spin coating method. Next, a transfer pattern (light shielding pattern) to be formed on the light-shielding film 2 was exposure-drawn on the resist film, followed by predetermined treatment, such as development treatment, to form a resist pattern 4a having the transfer pattern (FIG. 2(a)). Subsequently, a transfer pattern (hard mask pattern 3a) was formed on the hard mask film 3 through dry etching using the resist pattern 4a as a mask and using a mixed gas of a chlorine-based gas and an oxygen gas (FIG. 2(b)).

Figure 2A:
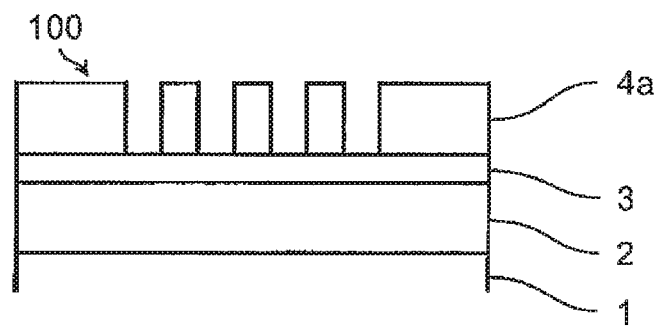
FIG. 2 includes sectional views for illustrating manufacturing steps for a transfer mask according to an embodiment of this invention.
Figure 2B:
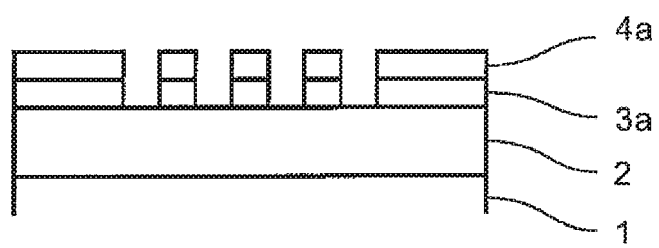
Figure 2C:
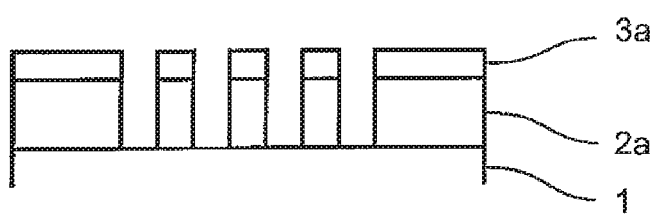
Figure 2D:
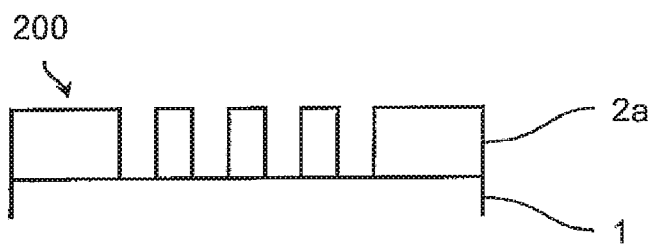

Next, after the resist pattern 4a was removed, a transfer pattern (light shielding pattern 2a) was formed on the light-shielding film 2 through dry etching using the hard mask pattern 3a as a mask and using a fluorine-based gas (FIG. 2(c)). Further, the hard mask pattern 3a was removed through dry etching using a mixed gas of a chlorine-based gas and an oxygen gas, and subjected to predetermined treatment, such as cleaning. Thus, the transfer mask (binary mask) 200 was obtained (FIG. 2(d)).

The chlorine-based gas to be used in the dry etching is not particularly limited as long as the chlorine-based gas contains Cl. Examples of the chlorine-based gas include $Cl_2$, $SiCl_2$, $CHCl_3$, $CH_2Cl_2$, $CCl_4$, and $BCl_3$. In addition, the fluorine-based gas to be used in the dry etching is not particularly limited as long as the fluorine-based gas contains F. Examples of the fluorine-based gas include $CHF_3$, $C_2F_6$, $C_4F_6$, and $SF_6$. In particular, a fluorine-based gas free of C may cause less damage to the transparent substrate 1 because the etching rate of the transparent substrate 1 formed of a glass material is relatively low.

Further, a method of manufacturing a semiconductor device of this invention includes exposure-transferring a pattern on a resist film on a semiconductor substrate by using the transfer mask 200 described above, or the transfer mask 200 manufactured by using the mask blank 100 described above. The transfer mask 200 and the mask blank 100 of this invention have the above-mentioned effects, and hence, even when the transfer mask 200 in which the EB defect repair has been performed on the opaque defect portion and which has been subjected to cumulative irradiation with the ArF excimer laser exposure light is set to a mask stage of an exposure apparatus using the ArF excimer laser as exposure light, and the transfer pattern is exposure-transferred onto the resist film on the semiconductor substrate, the pattern can be transferred onto the resist film on the semiconductor substrate with such accuracy as to sufficiently satisfy design specifications. Therefore, when a circuit pattern is formed through dry etching of a lower layer film using the pattern of the resist film as a mask, the circuit pattern can be formed with high accuracy without wiring short circuit and disconnection resulting from insufficient accuracy.

EXAMPLES

The embodiments of this invention are described below in more detail by way of Examples.

Example 1

[Manufacturing of Mask Blank]

A transparent substrate 1 formed of synthetic quartz glass having dimensions of a main surface of about 152 mm by about 152 mm and a thickness of about 6.25 mm was prepared. The transparent substrate 1 was a substrate in which its end surfaces and main surface had been polished to a predetermined surface roughness, and which had then been subjected to predetermined cleaning treatment and drying treatment.

Next, the transparent substrate 1 was placed in a sheet-type RF sputtering apparatus, and a high nitrided layer 22 formed of silicon and nitrogen (Si:N=44 atom %:56 atom %) was formed on the transparent substrate 1 so as to have a thickness of 5 nm by reactive sputtering (RF sputtering) using a silicon (Si) target and using a mixed gas of krypton (Kr), helium (He), and nitrogen ($N_2$) (flow rate ratio Kr:He:$N_2$=1:11:3, pressure=0.092 Pa) as a sputtering gas at a power of a RF power source of 2.8 kW. Only the high nitrided layer 22 was formed on a main surface of another transparent substrate under the same conditions, and the optical characteristics of the high nitrided layer 22 were measured with a spectroscopic ellipsometer (M-2000D manufactured by J. A. Woollam Co., Inc.). As a result, it was found that the high nitrided layer 22 had a refractive index n of 2.56 and an extinction coefficient k of 0.36 at a wavelength of 193 nm.

The film formation conditions of the high nitrided layer 22 were selected as follows: a relationship between a flow rate ratio of a $N_2$ gas in the mixed gas of a Kr gas, a He gas, and the $N_2$ gas serving as the sputtering gas and a film formation speed was examined in advance using the sheet-type RF sputtering apparatus having been used, and film formation conditions, such as a flow rate ratio, under which a film was able to be stably formed in a poison mode (reactive mode) region were selected. In addition, the result of the composition of the high nitrided layer 22 was obtained through measurement by X-ray photoelectron spectroscopy (XPS). The same applies to other films.

Next, the transparent substrate 1 on which the high nitrided layer 22 had been laminated was placed in the sheet-type RF sputtering apparatus, and a low nitrided layer 21 formed of silicon and nitrogen (Si:N=62 atom %:38 atom %) was formed on the high nitrided layer 22 so as to have a thickness of 19 nm by reactive sputtering (RF sputtering) using a silicon (Si) target and using a mixed gas of krypton (Kr), helium (He), and nitrogen ($N_2$) (flow rate ratio Kr:He:$N_2$=1:11:1, pressure=0.037 Pa) as a sputtering gas at a power of a RF power source of 2.8 kW. Only the low nitrided layer 21 was formed on a main surface of another transparent substrate under the same conditions, and the optical characteristics of the low nitrided layer 21 were measured with a spectroscopic ellipsometer (M-2000D manufactured by J. A. Woollam Co., Inc.). As a result, it was found that the low nitrided layer 21 had a refractive index n of 1.64 and an extinction coefficient k of 1.86 at a wavelength of 193 nm.

The film formation conditions of the low nitrided layer 21 were selected as follows: a relationship between a flow rate ratio of a $N_2$ gas in the mixed gas of a Kr gas, a He gas, and the $N_2$ gas serving as the sputtering gas and a film formation speed was examined in advance using the sheet-type RF sputtering apparatus having been used, and film formation conditions, such as a flow rate ratio, under which a film was able to be stably formed in a metallic mode region were selected.

By the above-mentioned procedures, a laminate structure in which the high nitrided layer 22 and the low nitrided layer 21 were laminated in the stated order was formed in contact with the surface of the transparent substrate 1. Next, two more laminate structures of the high nitrided layer 22 and the low nitrided layer 21 were formed by the same procedures in contact with a surface of the low nitrided layer 21 on the transparent substrate 1 on which the laminate structure had been formed.

Next, the transparent substrate 1 on which the three laminate structures of the high nitrided layer 22 and the low nitrided layer 21 had been formed was placed in the sheet-type RF sputtering apparatus, and an uppermost layer 23 was formed in contact with a surface of the low nitrided layer 21 farthest from a transparent substrate 1 side so as to have a thickness of 5 nm under the same film formation conditions as in the formation of the high nitrided layer 22. By the above-mentioned procedures, a light-shielding film 2 including the three laminate structures of the high nitrided layer 22 and the low nitrided layer 21, and including the uppermost layer 23 thereon, that is, having a total seven layer structure was formed on the transparent substrate 1 so as to have an entire thickness of 77 nm.

Next, the transparent substrate 1 on which the light-shielding film 2 had been formed was subjected to heat treatment in the air under the conditions of a heating temperature of 500° C. and a treatment time period of 1 hour. The optical density of the light-shielding film 2 after the heat treatment was measured at a wavelength (about 193 nm) of ArF excimer laser light, and was found to be 2.93.

The light-shielding film 2 was formed on another transparent substrate 1 and subjected to heat treatment by the same procedures, and a section of the light-shielding film 2 was observed with a transmission electron microscope (TEM). As a result, the light-shielding film 2 had a structure in which the uppermost layer 23 had a gradient composition in which the content of oxygen was increased with distance from the transparent substrate 1 side. In addition, it was confirmed that mixed regions each having a thickness of about 1 nm were formed in the vicinity of (three) interfaces between the high nitrided layer 22 and the low nitrided layer 21.

Next, the transparent substrate 1 on which the light-shielding film 2 having been subjected to heat treatment had been formed was placed in the sheet-type DC sputtering apparatus, and a hard mask film 3 formed of CrN (Cr:N=75 atom %:25 atom %) was formed in contact with a surface of the light-shielding film 2 so as to have a thickness of 5 nm by reactive sputtering (DC sputtering) using a chromium (Cr) target and using a mixed gas of argon (Ar) and nitrogen ($N_2$) as a sputtering gas. Further, the hard mask film 3 was adjusted so that a stress in the hard mask film 3 was reduced to the extent possible (a film stress preferably substantially became zero) without an influence on a film stress in the light-shielding film 2 by being annealed at a temperature lower than in the annealing treatment of the light-shielding film 2. By the above-mentioned procedures, a mask blank 100 having a structure in which the light-shielding film 2 having the seven layer structure and the hard mask film 3 were laminated on the transparent substrate 1 was manufactured.

[Manufacturing of Transfer Mask]

Next, a transfer mask (binary mask) 200 of Example 1 was manufactured by the following procedures using the mask blank 100 of Example 1.

First, a resist film formed of a chemically amplified resist for electron beam lithography was formed in contact with a surface of the hard mask film 3 so as to have a thickness of 80 nm by a spin coating method. Next, a transfer pattern to be formed on the light-shielding film 2 was drawn on the resist film by an electron beam, followed by predetermined development treatment and cleaning treatment, to thereby form a resist pattern 4a having the transfer pattern (FIG. 2(a)). At this time, to the transfer pattern having been drawn by an electron beam, a program defect was added as well as a transfer pattern to be originally formed so that an opaque defect was formed in the light-shielding film 2.

Next, a transfer pattern (hard mask pattern 3a) was formed on the hard mask film 3 through dry etching using the resist pattern 4a as a mask and using a mixed gas of chlorine and oxygen (gas flow rate ratio $Cl_2:O_2=4:1$) (FIG. 2(b)). Next, the resist pattern 4a was removed. Subsequently, a transfer pattern (light shielding pattern 2a) was formed on the light-shielding film 2 through dry etching using the hard mask pattern 3a as a mask and using a fluorine-based gas (mixed gas of $SF_6$ and He) (FIG. 2(c)). Further, the hard mask pattern 3a was removed through dry etching using a mixed gas of chlorine and oxygen (gas flow rate ratio $Cl_2:O_2=4:1$), followed by predetermined treatment, such as cleaning. Thus, the transfer mask (binary mask) 200 was obtained (see FIG. 2(d)).

The transfer mask 200 of Example 1 thus manufactured serving as a binary mask was subjected to a mask pattern inspection with a mask inspection apparatus. As a result, it was confirmed that an opaque defect existed at a site of the light shielding pattern 2a at which the program defect had been arranged. EB defect repair was performed on the opaque defect portion. As a result, a high repair rate was obtained in the EB defect repair, and a ratio in repair rate of the light shielding pattern 2a to the transparent substrate 1 was as high as 2.7.

In addition, another transfer mask was manufactured by the same procedures as in Example 1, and EB defect repair was performed on an opaque defect of the light shielding pattern 2a serving as a program defect. Then, a side wall of the light shielding pattern 2a at a site having been subjected to the EB defect repair was observed with a TEM. As a result, a step on the side wall of the light shielding pattern 2a, which was caused by excessive repair of the low nitrided layer 21, was small, and fell within an acceptable range as a binary mask.

Next, the light shielding pattern 2a of the transfer mask 200 of Example 1 having been subjected to the EB defect repair was subjected to irradiation treatment with ArF excimer laser light at a cumulative irradiation amount of 20 $kJ/cm^2$. The amount of CD change in the light shielding pattern 2a before and after the irradiation treatment was about 2 nm, and fell within a range in which the transfer mask 200 was able to be used as a transfer mask. For the transfer mask 200 of Example 1 having been subjected to the EB defect repair and the irradiation treatment with the ArF excimer laser light, simulation of a transfer image formed through exposure transfer on a resist film on a semiconductor substrate using exposure light having a wavelength of 193 nm was performed with AIMS 193 (manufactured by Carl Zeiss).

The exposure transfer image formed through the simulation was examined, and as a result, was found to sufficiently satisfy design specifications. In addition, a transfer image at a portion having been subjected to the EB defect repair was in no way inferior to transfer images in other regions. From the result, it can be said that, even when the transfer mask 200 of Example 1 having been subjected to the EB defect repair and the cumulative irradiation with ArF excimer laser is placed on a mask stage of an exposure apparatus to perform exposure transfer on a resist film on a semiconductor substrate, a circuit pattern to be finally formed on the semiconductor substrate can be formed with high accuracy.

Example 2

[Manufacturing of Mask Blank]

A mask blank 100 of Example 2 was manufactured by the same procedures as with the mask blank 100 of Example 1 except that the light-shielding film 2 was changed. Specifically, in a light-shielding film of Example 2, the thickness of a high nitrided layer 22 was set to 2.5 nm, the thickness of a low nitrided layer 21 was set to 11.5 nm, five laminate structures of the high nitrided layer 22 and the low nitrided layer 21 were formed in total, and the thickness of an uppermost layer 23 was set to 2.5 nm. That is, a light-shielding film 2 including the five laminate structures of the high nitrided layer 22 and the low nitrided layer 21, and including the uppermost layer 23 thereon, that is, having a total 11 layer structure was formed on a transparent substrate 1 so as to have an entire thickness of 72.5 nm.

Also in Example 2, the transparent substrate 1 on which the light-shielding film 2 had been formed was subjected to heat treatment in the air under the conditions of a heating temperature of 500° C. and a treatment time period of 1 hour. The optical density of the light-shielding film 2 after the heat treatment was measured at a wavelength (about 193 nm) of ArF excimer laser light, and was found to be 3.00.

The light-shielding film 2 was formed on another transparent substrate 1 and subjected to heat treatment by the same procedures, and a section of the light-shielding film 2 was observed with a TEM. As a result, the light-shielding film 2 had a structure in which the uppermost layer 23 had a gradient composition in which the content of oxygen was increased with distance from the transparent substrate 1 side. In addition, it was confirmed that mixed regions each having a thickness of about 1 nm were formed in the vicinity of (three) interfaces between the high nitrided layer 22 and the low nitrided layer 21.

By the above-mentioned procedures, the mask blank 100 of Example 2 having a structure in which the light-shielding film 2 having the 11 layer structure and the hard mask film 3 were laminated on the transparent substrate 1 was manufactured.

[Manufacturing of Transfer Mask]

Next, a transfer mask 200 of Example 2 was manufactured by the same procedures as in Example 1 using the mask blank 100 of Example 2. The transfer mask 200 of Example 2 thus manufactured serving as a binary mask was subjected to a mask pattern inspection with a mask inspection apparatus. As a result, it was confirmed that an opaque defect existed at a site of the light shielding pattern 2a at which the program defect had been arranged. EB defect repair was performed on the opaque defect portion. As a result, a high repair rate was obtained in the EB defect repair, and a ratio in repair rate between the light shielding pattern 2a and the transparent substrate 1 was as high as 3.3.

In addition, another transfer mask was manufactured by the same procedures as in Example 2, and EB defect repair was performed on an opaque defect of the light shielding pattern 2a serving as a program defect. Then, a side wall of the light shielding pattern 2a at a site having been subjected to the EB defect repair was observed with a TEM. As a result, a step on the side wall of the light shielding pattern 2a, which was caused by excessive repair of the low nitrided layer 21, was small, and fell within an acceptable range as a binary mask.

Next, the light shielding pattern 2a of the transfer mask 200 of Example 2 having been subjected to the EB defect repair was subjected to irradiation treatment with ArF excimer laser light at a cumulative irradiation amount of 20 kJ/cm$^2$. The amount of CD change in the light shielding pattern 2a before and after the irradiation treatment was about 2 nm, and fell within a range in which the transfer mask 200 was able to be used as a transfer mask. For the transfer mask 200 of Example 2 having been subjected to the EB defect repair and the irradiation treatment with the ArF excimer laser light, simulation of a transfer image formed through exposure transfer on a resist film on a semiconductor substrate using exposure light having a wavelength of 193 nm was performed with AIMS 193 (manufactured by Carl Zeiss).

The exposure transfer image formed through the simulation was examined, and as a result, was found to sufficiently satisfy design specifications. In addition, a transfer image at a portion having been subjected to the EB defect repair was in no way inferior to transfer images in other regions. From the result, it can be said that, even when the transfer mask 200 of Example 2 having been subjected to the EB defect repair and the cumulative irradiation with ArF excimer laser is placed on a mask stage of an exposure apparatus to perform exposure transfer on a resist film on a semiconductor substrate, a circuit pattern to be finally formed on the semiconductor device can be formed with high accuracy, Comparative Example 1

[Manufacturing of Mask Blank]

A mask blank of Comparative Example 1 was manufactured by the same procedures as with the mask blank 100 of Example 1 except that the light-shielding film was changed. Specifically, as a light-shielding film of Comparative Example 1, a light-shielding film having a three layer structure was formed so as to have an entire thickness of 79 nm by forming a high nitrided layer in contact with a surface of a transparent substrate so as to have a thickness of 12 nm, forming a low nitrided layer in contact with a surface of the high nitrided layer so as to have a thickness of 54 nm, and further forming an uppermost layer thereon so as to have a thickness of 13 nm by the same procedure as in Example 1.

Also in Comparative Example 1, the transparent substrate on which the light-shielding film had been formed was subjected to heat treatment in the air under the conditions of a heating temperature of 500° C. and a treatment time period of 1 hour. The optical density of the light-shielding film after the heat treatment was measured at a wavelength (about 193 nm) of ArF excimer laser light, and was found to be 2.96.

The light-shielding film was formed on another transparent substrate and subjected to heat treatment by the same procedures, and a section of the light-shielding film was observed with a TEM. As a result, the light-shielding film had a structure in which the uppermost layer had a gradient composition in which the content of oxygen was increased with distance from the transparent substrate side. In addition, it was confirmed that a mixed region having a thickness of about 1 nm was formed in the vicinity of an interface between the low nitrided layer and the high nitrided layer. By the above-mentioned procedures, the mask blank of Comparative Example 1 having a structure in which the light-shielding film having the three layer structure and the hard mask film were laminated on the transparent substrate was manufactured.

[Manufacturing of Transfer Mask]

Next, a transfer mask of Comparative Example 1 was manufactured by the same procedures as in Example 1 using the mask blank of Comparative Example 1. The transfer mask of Comparative Example 1 thus manufactured serving as a binary mask was subjected to a mask pattern inspection with a mask inspection apparatus. As a result, it was confirmed that an opaque defect existed at a site of the light shielding pattern at which the program defect had been arranged. EB defect repair was performed on the opaque defect portion. As a result, a low repair rate was obtained in the EB defect repair, and a ratio in repair rate between the light shielding pattern and the transparent substrate was as low as 2.0.

In addition, another transfer mask was manufactured by the same procedures as in Comparative Example 1, and EB defect repair was performed on an opaque defect of the light shielding pattern serving as a program defect. Then, a side wall of the light shielding pattern at a site having been subjected to the EB defect repair was observed with a TEM. As a result, a step on the side wall of the light shielding pattern, which was caused by excessive repair of the low nitrided layer, was large, and exceeded an acceptable range as a binary mask.

Next, the light shielding pattern of the transfer mask of Comparative Example 1 having been subjected to the EB defect repair was subjected to irradiation treatment with ArF excimer laser light at a cumulative irradiation amount of 20 kJ/cm$^2$. The amount of CD change in the light shielding pattern before and after the irradiation treatment was about 2 nm, and fell within a range in which the transfer mask was able to be used as a transfer mask. For the transfer mask of Comparative Example 1 having been subjected to the EB defect repair and the irradiation treatment with the ArF excimer laser light, simulation of a transfer image formed through exposure transfer on a resist film on a semiconductor substrate using exposure light having a wavelength of 193 nm was performed with AIMS 193 (manufactured by Carl Zeiss).

The exposure transfer image formed through the simulation was examined, and as a result, was found to approximately sufficiently satisfy design specifications in regions other than a portion having been subjected to the EB defect repair. However, a transfer image at the portion having been subjected to the EB defect repair was such an image that a transfer failure occurred owing to a step on the side wall of the light shielding pattern. From the result, it is presumed that, when the transfer mask of Comparative Example 1 having been subjected to the EB defect repair is placed on a mask stage of an exposure apparatus to perform exposure transfer on a resist film on a semiconductor substrate, disconnection or short circuit occurs in a circuit pattern to be finally formed on the semiconductor device.

A light-shielding film having a structure (four layer structure) in which two laminate structures of a high nitrided layer and a low nitrided layer were formed was formed on a transparent substrate by the same procedures as in Example 1 so that the total thickness of the high nitrided layers and the total thickness of the low nitrided layers were adjusted to be almost the same as in the above-mentioned light-shielding films having a two layer structure and a six layer structure. EB defect repair was performed on the light-shielding film, and a repair rate in the EB defect repair was measured. As a result, it was confirmed that a difference in repair rate in the EB defect repair between the light-shielding film having the four layer structure and the light-shielding film having the two layer structure was significantly small, and fell short of reaching a remarkable difference in repair rate in the EB defect repair between the light-shielding film having the six layer structure and the light-shielding film having the four layer structure.

REFERENCE SIGNS LIST 1 transparent substrate
2 light-shielding film
21 low nitrided layer
22 high nitrided layer
23 uppermost layer
2a light shielding pattern
3 hard mask film
3a hard mask pattern
4a resist pattern
100 mask blank
200 transfer mask

The invention claimed is:

1. A mask blank, comprising a light-shielding film on a transparent substrate,
wherein the light-shielding film has an optical density for ArF excimer laser exposure light of 2.5 or more,
wherein the light-shielding film has a stack of at least three layered structures, each of the at least three layered structures having a high nitrided layer and a low nitrided layer,
wherein the high nitrided layer and the low nitrided layer are each formed of a material including silicon and nitrogen, or a material including silicon, nitrogen, and one or more elements selected from metalloid elements and non-metallic elements,
wherein the high nitrided layer has a content of nitrogen of 50 atom % or more, and has a thickness of 10 nm or less,
wherein the low nitrided layer has a content of nitrogen of less than 50 atom %, and
wherein a thickness of the low nitrided layer is twice or more as large as the thickness of the high nitrided layer.

2. The mask blank according to claim 1, wherein the high nitrided layer and the low nitrided layer are formed of the same constituent elements.

3. The mask blank according to claim 1, wherein the high nitrided layer and the low nitrided layer each consist essentially of silicon and nitrogen.

4. The mask blank according to claim 1, wherein, in each of the at least three layered structures, the high nitrided layer is closer to the transparent substrate than the low nitrided layer is.

5. The mask blank according to claim 1, wherein the light-shielding film comprises, at a position farthest from the transparent substrate, an uppermost layer formed of a material including silicon, nitrogen, and oxygen, or a material including silicon, nitrogen, and one or more elements selected from metalloid elements and non-metallic elements.

6. The mask blank according to claim 1, further comprising a hard mask film on the light-shielding film.

7. A method of manufacturing a transfer mask including using the mask blank according to claim 6, the method comprising:
forming a transfer pattern on the hard mask film through dry etching;
forming a transfer pattern on the light-shielding film through dry etching using the hard mask film having the transfer pattern as a mask; and
removing the hard mask film.

8. A method of manufacturing a semiconductor device, comprising exposure-transferring a transfer pattern on a resist film on a semiconductor substrate by using a transfer mask manufactured by the method of manufacturing a transfer mask according to claim 7.

9. A transfer mask, comprising a light-shielding film having a transfer pattern on a transparent substrate,
wherein the light-shielding film has an optical density for ArF excimer laser exposure light of 2.5 or more,
wherein the light-shielding film has a stack of at least three layered structures, each of the at least three layered structures having a high nitrided layer and a low nitrided layer,
wherein the high nitrided layer and the low nitrided layer are each formed of a material including silicon and nitrogen, or a material including silicon, nitrogen, and one or more elements selected from metalloid elements and non-metallic elements,
wherein the high nitrided layer has a content of nitrogen of 50 atom % or more, and has a thickness of 10 nm or less,
wherein the low nitrided layer has a content of nitrogen of less than 50 atom %, and
wherein a thickness of the low nitrided layer is twice or more as large as the thickness of the high nitrided layer.

10. The transfer mask according to claim 9, wherein the high nitrided layer and the low nitrided layer are formed of the same constituent elements.

11. The transfer mask according to claim 9, wherein the high nitrided layer and the low nitrided layer each consist essentially of silicon and nitrogen.

12. The transfer mask according to claim 9, wherein, in each of the at least three layered structures, the high nitrided layer is closer to the transparent substrate than the low nitrided layer is.

13. The transfer mask according to claim 9, wherein the light-shielding film comprises, at a position farthest from the transparent substrate, an uppermost layer formed of a material including silicon, nitrogen, and oxygen, or a material including silicon, nitrogen, and oxygen and one or more elements selected from metalloid elements and non-metallic elements.

14. A method of manufacturing a semiconductor device, comprising exposure-transferring a transfer pattern on a resist film on a semiconductor substrate by using the transfer mask according to claim 9.

* * * * *